US008631371B2

(12) United States Patent
Lu (10) Patent No.: US 8,631,371 B2
(45) Date of Patent: Jan. 14, 2014

(54) METHOD, SYSTEM AND PROGRAM STORAGE DEVICE FOR MODELING THE CAPACITANCE ASSOCIATED WITH A DIFFUSION REGION OF A SILICON-ON-INSULATOR DEVICE

(75) Inventor: Ning Lu, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 189 days.

(21) Appl. No.: 13/171,528

(22) Filed: Jun. 29, 2011

(65) Prior Publication Data
US 2013/0007686 A1    Jan. 3, 2013

(51) Int. Cl.
*G06F 17/50* (2006.01)
(52) U.S. Cl.
USPC .................... 716/115; 716/110; 716/111
(58) Field of Classification Search
USPC ................................................. 716/110, 115
See application file for complete search history.

(56) References Cited

U.S. PATENT DOCUMENTS

| | | | |
|---|---|---|---|
| 6,061,508 A | 5/2000 | Mehrotra et al. | |
| 6,068,660 A | 5/2000 | Lu | |
| 6,562,666 B1 | 5/2003 | Park et al. | |
| 6,632,686 B1 | 10/2003 | Keshavarzi et al. | |
| 6,750,513 B2 | 6/2004 | Ohyanagi et al. | |
| 6,876,036 B2 | 4/2005 | Bourdillon | |
| 7,037,795 B1 | 5/2006 | Barr et al. | |
| 7,073,139 B2* | 7/2006 | Bard et al. | 716/111 |
| 7,608,879 B2 | 10/2009 | Maeda et al. | |
| 7,763,950 B2 | 7/2010 | Shimizu | |
| 2003/0237063 A1* | 12/2003 | Kauth et al. | 716/5 |
| 2011/0221519 A1* | 9/2011 | Katoh et al. | 327/558 |

OTHER PUBLICATIONS

Anonymous, "Method and System for Extracting Different Elements Present in a Silicon-on-Insulator (SOI) Substrate," Technical Disclosure, IPCOM000201540D, IP.COM, Nov. 15, 2010.
BSIMSOIv4.4 MOSFET Model, Users' Manual, Copyright 2010, UC Berkeley, Chapter 4, pp. 21-33, http://www-device.eecs.berkeley.edu/~bsimsoi/archive/bsimsoi4p4/BSIMSOIv4.4_UsersManual.pdf.
Ning Lu, U.S. Appl. No. 13/038,460, filed Mar. 2, 2011.
Ning Lu, U.S. Appl. No. 13/151,313, filed Jun. 2, 2011.

* cited by examiner

*Primary Examiner* — Vuthe Siek
*Assistant Examiner* — Eric Lee
(74) *Attorney, Agent, or Firm* — Gibb & Riley, LLC; Anthony J. Canale (57) ABSTRACT

Disclosed are embodiments of a method, system and program storage device for accurately modeling parasitic capacitance (s) associated with a diffusion region of a silicon-on-insulator (SOI) device and doing so based, at least in part, on proximity to adjacent conductive structures. In these embodiments, the layout of an integrated circuit design can be analyzed to determine, for the diffusion region, shape, dimension and proximity information. Then, a formula can be developed and used for determining the parasitic capacitance between the diffusion region and the substrate below ($C_{D-S}$). This formula can have a perimeter component, including a side edge component and, if applicable, a corner component, both of which account for the fact that $C_{D-S}$ is generally dependent on the distances between the diffusion region and any adjacent conductive structures. Additionally, the parasitic capacitance between the diffusion region and any adjacent conductive structure ($C_{D-D}$) can be determined based on such distances.

23 Claims, 7 Drawing Sheets

METHOD, SYSTEM AND PROGRAM STORAGE DEVICE FOR MODELING THE CAPACITANCE ASSOCIATED WITH A DIFFUSION REGION OF A SILICON-ON-INSULATOR DEVICE

BACKGROUND

1. Field of the Invention

The embodiments disclosed herein relate to modeling parasitic capacitances associated with a diffusion region of a silicon-on-insulator (SOI) device and, more particularly, to a method, a computer system, and a program storage device for modeling parasitic capacitances associated with a diffusion region (e.g., diffusion region to substrate capacitance and diffusion region to adjacent diffusion region capacitance) as a function of the distance between the diffusion region and the adjacent diffusion region(s).

2. Description of the Related Art

Parasitic capacitances associated with a diffusion region of a silicon-on-insulator (SOI) device (e.g., a source/drain region of a metal oxide semiconductor field effect transistor (MOSFET), a diffusion region of a metal oxide semiconductor (MOS) capacitor, etc.) can include, for example, the capacitance between that diffusion region and the substrate below as well as capacitances between that diffusion region and any adjacent conductive structures (e.g., any adjacent diffusion regions of other SOI devices). Such parasitic capacitances can greatly impact SOI device performance. Thus, during SOI device design, accurate modeling of parasitic capacitances associated with each diffusion region is very important. However, the current techniques used to model may result in error. Therefore, there is a need in the art for a technique that can be used to more accurately model the parasitic capacitances associated with each diffusion region of an SOI device.

SUMMARY

In view of the foregoing disclosed herein are embodiments of a method, system and program storage device for accurately modeling parasitic capacitance(s) associated with a diffusion region of a silicon-on-insulator (SOI) device and doing so based, at least in part, on the proximity of the diffusion region to adjacent conductive structures (e.g., adjacent diffusion regions). Specifically, in these embodiments, the layout of an integrated circuit design can be analyzed in order to determine, for the diffusion region, shape, dimension and proximity information. Then, a formula can be developed and used for determining the parasitic capacitance between the diffusion region and the substrate below ($C_{D-S}$). This formula can have a perimeter component that includes a side edge component and, if applicable, a corner component, both of which account for the fact that $C_{D-S}$ is generally dependent on the distances between the diffusion region and any adjacent conductive structures. In these embodiments, the parasitic capacitance between the diffusion region and any adjacent conductive structure ($C_{D-D}$) can also be determined based on such distances.

More particularly, disclosed herein are embodiments of a computer-implemented method for modeling parasitic capacitance associated with a diffusion region of a silicon-on-insulator (SOI) device. The method can comprise analyzing an integrated circuit design layout in order to at least (1) identify side edges of the diffusion region that are capacitively coupled to adjacent conductive structures and (2) determine distances from each of the side edges to the adjacent conductive structures. Then, a formula for determining a parasitic capacitance ($C_{D-S}$) between the diffusion region and a substrate below the diffusion region can be developed. This formula for $C_{D-S}$ can be developed so that it has an area component and a perimeter component and further so that the perimeter component takes into consideration proximity to adjacent conductive structures. Specifically, the perimeter component can have a side edge component and, if applicable, a corner component and both the side edge and corner components can be based on previously determined distances between the side edges of the diffusion region and the adjacent conductive structures. Once the formula for $C_{D-S}$ is developed, it can be used to determine $C_{D-S}$. Specifically, such a formula can, for example, be used by SOI device models and parasitic extraction tools, which determine parasitics and generate a SPICE (Simulation Program with Integrated Circuit Emphasis) netlist based a circuit layout. Optionally, the method embodiment can further comprise developing formulas for second parasitic capacitances ($C_{D-D}$) between the diffusion region and each of the adjacent conductive structures, based on the previously established distances between the side edges of the diffusion region and the adjacent conductive structures. Specifically, like the formula for $C_{D-S}$ mentioned above, the formulas for $C_{D-D}$ can, for example, be used by SOI device models and parasitic extraction tools, which determine parasitics and generate a SPICE (Simulation Program with Integrated Circuit Emphasis) netlist based a circuit layout. Thus, the capacitance $C_{D-S}$ between the diffusion region and the substrate and, if determined, the capacitances $C_{D-D}$ between the diffusion region and each of the adjacent structures can then be used to more accurately simulate the performance of the SOI device.

Also, disclosed herein are embodiments of a computer system for modeling parasitic capacitance associated with a diffusion region of a silicon-on-insulator (SOI) device. The computer system embodiments can comprise a memory and at least one processor. The memory can store an integrated circuit design layout. The processor(s) can comprise at least a layout analyzer, a capacitance formula generator and a capacitance calculator. The layout analyzer can access the layout and can analyze it in order to at least (1) identify side edges of the diffusion region that are capacitively coupled to adjacent conductive structures and (2) determine distances from each of the side edges to the adjacent conductive structures. Then, the capacitance formula generator can develop a formula for determining a parasitic capacitance ($C_{D-S}$) between the diffusion region and a substrate below the diffusion region. This formula for $C_{D-S}$ can be developed by the generator so that it has an area component and a perimeter component and further so that the perimeter component takes into consider proximity to adjacent conductive structures. Specifically, the perimeter component can have a side edge component and, if applicable, a corner component and both the side edge and corner components can be based on previously determined distances between the side edges of the diffusion region and the adjacent conductive structures. Once the formula for $C_{D-S}$ is developed by the capacitance formula generator, it can be used by the capacitance calculator to determine $C_{D-S}$. Specifically, such a formula can, for example, be used by SOI device models and parasitic extraction tools, which determine parasitics and generate a SPICE (Simulation Program with Integrated Circuit Emphasis) netlist based a circuit layout. Optionally, the capacitance formula generator can also generate formulas for calculating second parasitic capacitances ($C_{D-D}$) between the diffusion region and each of the adjacent conductive structures based on the previously established distances between the side edges of the diffusion region and the adjacent conductive structures. Once the formulas for the capacitances $C_{D-D}$ are developed by the capacitance formula generator, they can be used by the capacitance calculator to determine the capacitances $C_{D-D}$. Specifically, like the formula for $C_{D-S}$ mentioned above, the formulas for $C_{D-D}$ can, for example, be used by SOI device models and parasitic extraction tools, which determine parasitics and generate a SPICE (Simulation Program with Integrated Circuit Emphasis) netlist based a circuit layout. Thus, the capacitance $C_{D-S}$ between the diffusion region and the substrate and, if determined, the capacitances $C_{D-D}$ between the diffusion region and each of the adjacent structures can then be used by a simulator to more accurately simulate the performance of the SOI device.

Finally, also disclosed are embodiments of non-transitory program storage device that is readable by a computer and that tangibly embodies a program of instructions executable by the computer to perform the above-described method embodiments for modeling parasitic capacitance associated with a diffusion region of a silicon-on-insulator (SOI) device.

BRIEF DESCRIPTION OF THE SEVERAL VIEWS OF THE DRAWINGS

The embodiments disclosed herein will be better understood from the following detailed description with reference to the drawings, which are not necessarily drawn to scale and in which.

DETAILED DESCRIPTION

The embodiments and the various features and advantageous details thereof are explained more fully with reference to the non-limiting embodiments that are illustrated in the accompanying drawings and detailed in the following description.

As mentioned above, parasitic capacitances associated with a diffusion region of a silicon-on-insulator (SOI) device (e.g., a source/drain region of a metal oxide semiconductor field effect transistor (MOSFET), a diffusion region of a metal oxide semiconductor (MOS) capacitor, etc.) can include, for example, the capacitance between that diffusion region and the substrate below ($C_{D-S}$) as well as capacitances between that diffusion region and any adjacent conductive structures ($C_{D-D}$) (e.g., any adjacent diffusion regions of other SOI devices). Such parasitic capacitances can greatly impact SOI device performance. Thus, during SOI device design, accurate modeling of parasitic capacitances associated with each diffusion region is very important. Unfortunately, the current techniques used to model may result in error.

Specifically, current techniques for modeling $C_{D-S}$ are based on an area component (i.e., capacitance between the bottom surface of the diffusion region and the substrate) and a perimeter component (i.e., capacitance between the side edges of the diffusion region, also referred to herein as the sidewalls of the diffusion region, and the substrate), each of which are dependent upon the separation distance between the diffusion region and the substrate (e.g., the height of the insulator layer ($h_{box}$)) but are independent of any proximity information. That is, current techniques do not consider separation distances between the diffusion region and any adjacent conductive structures (e.g., adjacent diffusion regions of other SOI devices). However, the Applicant has discovered that capacitive coupling with such adjacent conductive structures does impact $C_{D-S}$ and is a function of proximity.

Figure 1A:
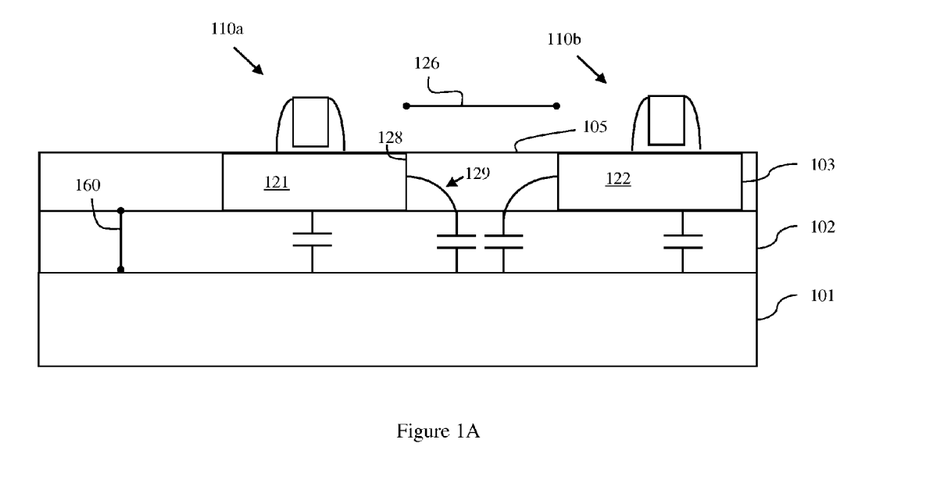
FIGS. 1A and 1B are cross-section diagrams illustrating how the amount of spacing between the diffusion regions of adjacent silicon-on-insulator (SOI) devices will impact the capacitance $C_{D-S}$ between those diffusion regions and the substrate below.
Figure 1B:
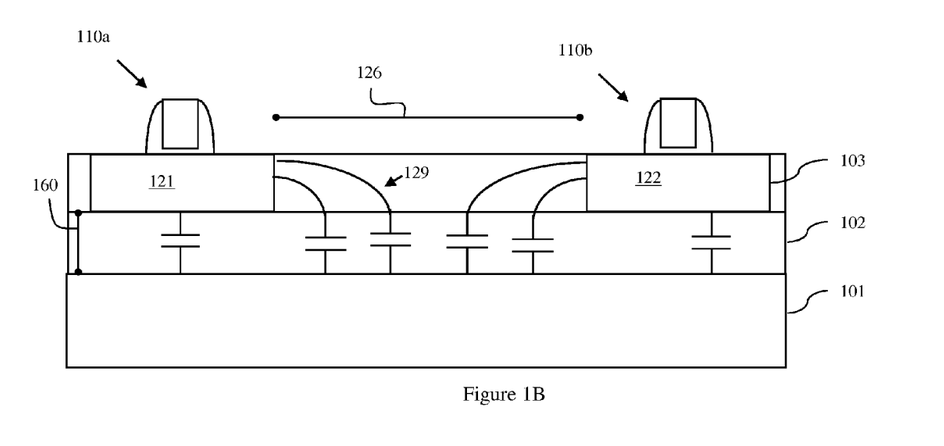

Specifically, referring to FIGS. 1A and 1B, two SOI devices 110a, 110b (e.g., MOSFETs) can be formed adjacent to each other on a substrate (e.g., on a silicon-on-insulator wafer comprising a semiconductor substrate 101, an insulator layer 102, such as a buried oxide (BOX) layer on the substrate 101 and a silicon layer 103 on the insulator layer 102). A shallow trench isolation (STI) region 105 can define the active regions of the SOI devices within the silicon layer 103 such that STI 105 is positioned laterally between adjacent diffusion regions 121, 122 (e.g., adjacent source/drain regions) of the SOI devices 110a and 110b, respectively. In this case, for each of the diffusion regions 121 and 122, $C_{D-S}$ is be based on an area component and a perimeter component, each of which are dependent upon the separation distance between the diffusion regions 121, 122 and the substrate 101 (e.g., the height 160 of the insulator layer ($h_{box}$) 102). However, the Applicant has discovered that additionally, the amount of spacing 126 between the diffusion regions 121 and 122 will impact the $C_{D-S}$ [also referred to herein as buried oxide capacitance ($C_{box}$)] associated with each of the diffusion regions 121 and 122. For example, a larger amount of spacing 126 (i.e., a greater distance between the diffusion regions 121 and 122), as shown in FIG. 1B, as compared to a smaller amount of spacing 126 between the diffusion regions 121 and 122, as shown in FIG. 1A, allows more electric field lines 129 from the diffusion region side edges 128 to the substrate 101. Thus, the larger amount of spacing 126 results in a greater perimeter component (i.e., a greater capacitance between the side edges of the diffusion region and the substrate) and, thereby a greater $C_{D-S}$. That is, $C_{D-S}$ is dependent on the spacing 126 (i.e., to the distances between the diffusion region at issue and any adjacent conductive structures, such as adjacent diffusion regions of other SOI devices). Additionally, for a given diffusion region side edge (e.g., side edge 128 of diffusion region 121) that is capacitively coupled to an adjacent conductive structure (e.g., to diffusion region 122), $C_{D-D}$ (i.e., diffusion region to diffusion region capacitance) will be proportional to the surface area of the side edge 128, but inversely proportional to the spacing 126. That is, a larger amount of spacing 126 as shown in FIG. 1B will result in a smaller $C_{D-D}$ as compared to the smaller amount of spacing 30 as shown in FIG. 1A.

In view of the foregoing disclosed herein are embodiments of a method, system and program storage device for accurately modeling parasitic capacitance(s) associated with a diffusion region of a silicon-on-insulator (SOI) device and doing so based, at least in part, on the proximity of the diffusion region to adjacent conductive structures (e.g., adjacent diffusion regions). Specifically, in these embodiments, the layout of an integrated circuit design can be analyzed in order to determine, for the diffusion region, shape, dimension and proximity information. Then, a formula can be developed and used for determining the parasitic capacitance between the diffusion region and the substrate below ($C_{D-S}$). This formula can have a perimeter component that includes a side edge component and, if applicable, a corner component, both of which account for the fact that $C_{D-S}$ is generally dependent on the distances between the diffusion region and any adjacent conductive structures. In these embodiments, the parasitic capacitance between the diffusion region and any adjacent conductive structure ($C_{D-D}$) can also be determined based on such distances.

More particularly, disclosed herein are embodiments of a computer-implemented method for modeling parasitic capacitance associated with a diffusion region of a silicon-on-insulator (SOI) device. Referring to the flow diagram of FIG. 2, method embodiments disclosed herein can comprise accessing (e.g., by a layout analyzer from a memory) an integrated circuit design layout (202). Those skilled in the art will recognize that an integrated circuit design layout is generally understood to be a set of geometric patterns (e.g., in the form of polygons), which specify the size, shapes and locations of the different components of devices within an integrated circuit as well as the electrical connections between them.

Figure 2:
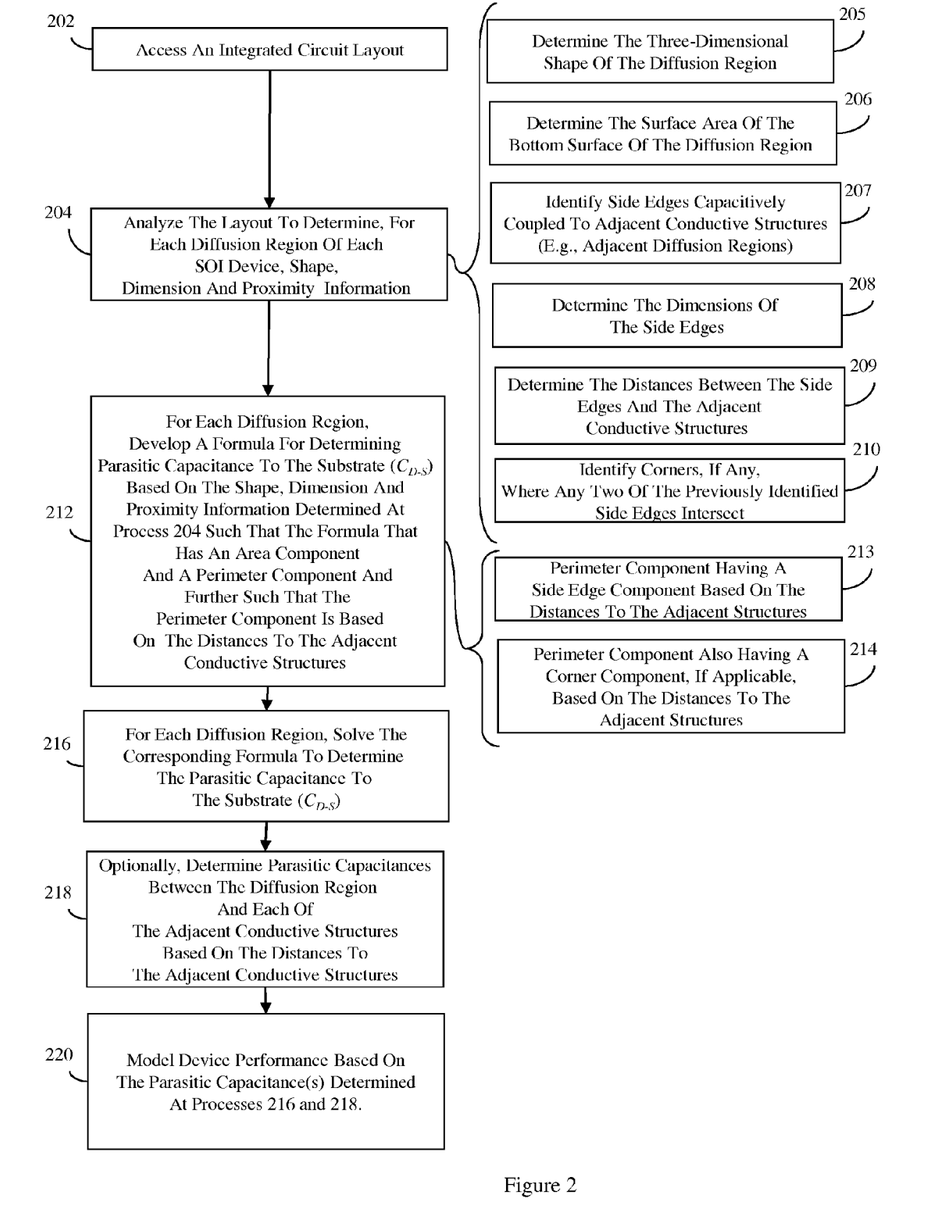
FIG. 2 is a flow diagram illustrating embodiments of a computer-implemented method for modeling parasitic capacitance associated with a diffusion region of a silicon-on-insulator (SOI) device.

Next, the layout can be analyzed (e.g., by the layout analyzer and based on a set of rules stored in memory) in order to determine shape, dimension and proximity information related to a specific diffusion region of a specific SOI device contained within the integrated circuit (204). Such information can be determined based on a set of rules and can include, but is not limited to, the following: the three-dimensional shape of the diffusion region (205); the surface area of the bottom of the diffusion region (206); any side edges of the diffusion region that are capacitively coupled to adjacent conductive structures (e.g., adjacent diffusion regions, polysilicon gate structures, any other conductive structure, etc.) (207); the dimensions (e.g., height, length, surface area) of each of those side edges (208); the distances from the side edges to the adjacent conductive structures (209); any corners where any two of the previously identified side edges intersect (210); and the separation distance between the diffusion region and the substrate (e.g., the height of the insulator layer ($h_{box}$) of an SOI wafer).

Figure 3:
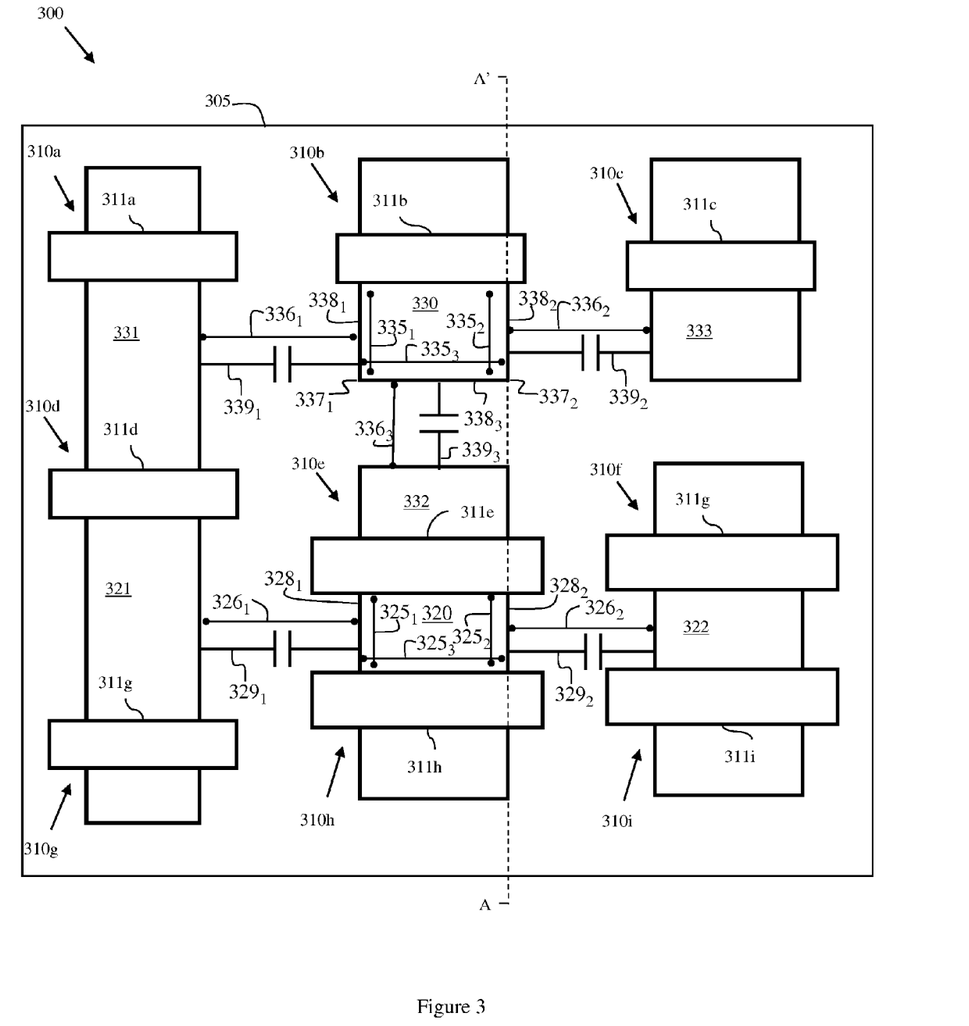
FIG. 3 is top view diagram illustrating an exemplary integrated circuit layout that can be analyzed according to the method of FIG. 2.
Figure 4:
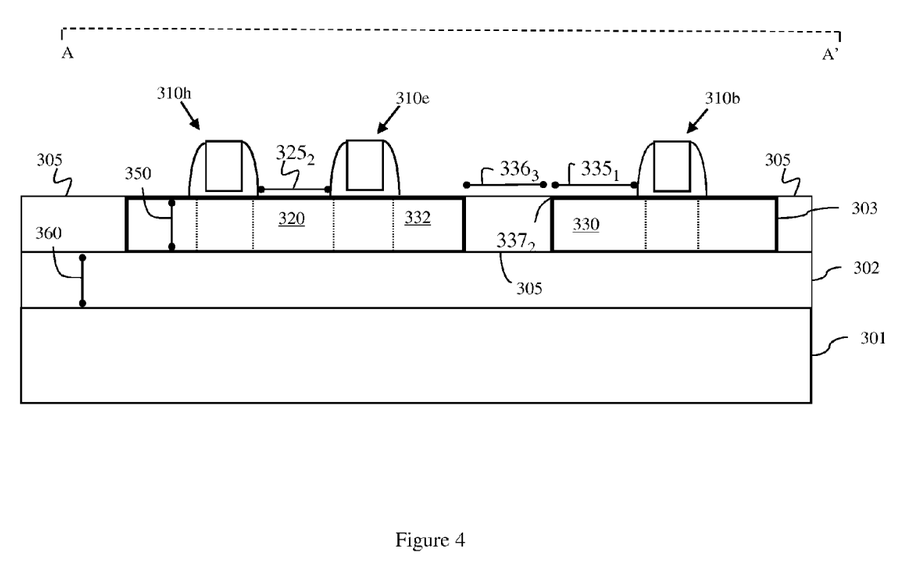
FIG. 4 is a vertical cross-section A-A' through the layout of FIG. 3.

Consider the top view illustration of an exemplary integrated circuit layout 300, as shown in FIG. 3, along with the vertically cross-section A-A' through this layout 300, as shown in FIG. 4. This integrated circuit design layout 300 indicates that the integrated circuit comprises a plurality of silicon-on-insulator (SOI) devices, such as metal oxide semiconductor field effect transistors (FETs) 310a-i. Each FET 310a-i comprises a corresponding gate structure 311a-i on a channel region, which is positioned laterally between diffusion regions (i.e., source/drain regions). Some of these FETs 310a-i are stacked such that they have shared diffusion regions. For example, FETS 310a, 310d and 310g are stacked with a shared diffusion region 331 between FETs 310a and 310d and another shared diffusion region 321 between FETs 310d and 310g. Similarly, FETs 310e and 310h are stacked with shared diffusion region 320 between them and FETs 310f and 310i are stacked with shared diffusion region 322 between them. However, others not stacked such that they have discrete diffusion regions (e.g., diffusion region 330 of FET 310b and diffusion region 333 of FET 310c). Additionally, as shown in FIG. 4, the FETs are formed on a silicon-on-insulator (SOI) wafer (i.e., a wafer comprising a semiconductor substrate 301, an insulator layer 302, such as a buried oxide (BOX) layer, on the substrate 301 and a silicon layer 303 on the insulator layer 302). A shallow trench isolation (STI) region 305 defines the active regions of the devices within the silicon layer 303 such that STI 305 is positioned laterally between adjacent diffusion regions.

At process 204, each of the diffusion regions of each of the FETs can be analyzed, as discussed above. For example, in the case of the diffusion region 330 of FET 310b, it can be determined that the diffusion region 330 has a three-dimensional rectangular shape, which is defined by two parallel side edges $338_1$, $338_2$, and an outer side edge $338_3$, which opposite the gate 311b and perpendicular to parallel side edges $338_1$ and $338_2$. Since the diffusion region 330 is essentially rectangular in shape, the surface area of the bottom of the diffusion region 330 will be equal to the length of one of the side edges (e.g., length $335_1$ of side edge $338_1$) times the length $335_3$ of the outer side edge $338_3$. Again, since the diffusion region 330 is essentially rectangular in shape, the surface areas of the side edges $338_{1-3}$ will be equal to the height 350 of the semiconductor layer 303 from which the diffusion region 330 is formed (also referred to herein as ($t_{si}$)) multiplied by the respective side edge lengths $335_{1-3}$. There are three side edges of the diffusion region 330 that are capacitively coupled to adjacent conductive structures (e.g., adjacent diffusion regions). That is, side edge $338_1$ is capacitively coupled (see capacitance $339_1$) to the adjacent shared diffusion region 331 of FETs 310a and 310d, side edge $338_2$ is capacitively coupled (see capacitance $339_2$) to the adjacent diffusion region 333 of FET 310c, and side edge $338_3$ is capacitively coupled (see capacitance $339_3$) to the adjacent diffusion region 332 of FET 310e. The side edges $338_{1-3}$ are separated from adjacent conductive structures 331-333, respectively, by distances $336_{1-3}$. There are two corners, where any two of the previously identified side edges intersect is two. That is, corner $337_1$ is where side edges $338_1$ and $338_2$ intersect and corner $337_2$ is where side edges $338_2$ and $338_3$ intersect. Finally, the diffusion region 330 and the substrate 301 are separated by a distance 360 (i.e., the height of the insulator layer 302, also referred to herein as ($h_{box}$)).

Similarly, in the case of shared diffusion region 320 of FETs 310e and 310h, it can be determined that the diffusion region 320 has a three-dimensional rectangular shape and the shape is defined by two parallel side edges $328_1$ and $328_2$, which are perpendicular to gates 311e and 311h. Since the diffusion region 320 is essentially rectangular in shape, the surface area of the bottom of the diffusion region 320 will be equal to the length of one of the side edges (e.g., length $325_1$ of side edge $328_1$) times the width $325_3$ of the diffusion region, as measured parallel to the gates. Since the diffusion region 320 is essentially rectangular in shape, the surface areas the side edges $338_{1-2}$ will be equal to the height 350 of the semiconductor layer 303 from which the diffusion region 320 is formed multiplied by the respective side edge lengths $325_{1-2}$. There are two side edges of the diffusion region that are capacitively coupled to adjacent conductive structures (e.g., adjacent diffusion regions) is two. That is, side edge $328_1$ is capacitively coupled (see capacitance $329_1$) to the adjacent shared diffusion region 321 of FETs 310d and 310g and side edge $328_2$ is capacitively coupled (see capacitance $329_2$) to the adjacent shared diffusion region 322 of FETs 310f and 310i. The side edges $328_{1-2}$ are separated from the adjacent conductive structures 321-322, respectively, by distances $326_{1-2}$. Since the only two capacitively coupled side edges $328_{1-2}$ are parallel to each other (i.e., they do not intersect), the number of corners is zero. Finally, the diffusion region 330 and the substrate 301 are separated by a distance 360 [i.e., the height of the insulator layer 302, also referred to herein as ($h_{box}$)].

This process 204 can be repeated for each of the diffusion regions in the layout 300.

Next, for each diffusion region, a formula can be developed (e.g., by a capacitance formula generator and based on set of rules stored in memory) for determining the parasitic capacitance ($C_{D-S}$) between that diffusion region and the substrate 301 below the diffusion region (212). This formula for $C_{D-S}$ can specifically be developed based on the shape, dimension and proximity information determined at process 204.

It should be noted that, since the wafer associated with the exemplary integrated circuit layout 300 is a silicon-on-insulator (SOI) wafer and, thus, the diffusion regions are separated from the substrate 301 by an insulator layer 302 (e.g., a buried oxide (BOX) layer), $C_{D-S}$ is also referred to herein as buried oxide capacitance ($C_{box}$).

As with prior art techniques, this formula for $C_{D-S}$ can be developed such that $C_{D-S}$ is based on an area component associated with the bottom surface of the diffusion region and on a perimeter component associated with the side edges of the diffusion region, each of which is dependent upon the separation distance between the diffusion regions and the substrate (e.g., the height 360 of the insulator layer ($h_{box}$) 302). However, in the embodiments disclosed herein, the perimeter component is based, not only on the surface area of the side edges of the diffusion region and the height 360 of the insulator layer ($h_{box}$) 302 separating it from the substrate, but also on the distances, determined at process 204, between the side edges of the diffusion region and the adjacent conductive structures. Specifically, the perimeter component can have a side edge component that is equal to a sum of capacitances associated with each of the side edges identified and each side edge capacitance can be based on the length of that side edge as well as the distance between that side edge and an adjacent conductive structure (213). If applicable, the perimeter component can also have a corner component that is equal to the sum of capacitances associated with the each of the corners identified and each corner capacitance can be based on the distances between the side edges that intersect at the corner and the adjacent conductive structures (214). That is, each corner capacitance can be based on a first distance from a first side edge at a given corner to a first conductive structure adjacent to the first side edge and further based on a second distance from a second side edge at the given corner to a second conductive structure adjacent to the second side edge.

For example, consider the case of the diffusion region 330 of FET 310b of FIGS. 3 and 4. The following formula can be developed at process 212 to express the area and perimeter components of the capacitance $C_{D-S}$ between the diffusion region 330 and the substrate 301:

$$C_{D-S}=C_aA+[C_e(d_1)l_1+C_e(d_2)l_2+C_e(d_3)w+C_c(d_1,d_3)+C_c(d_2,d_3)], \quad (1)$$

where A is the surface area of the bottom of the diffusion region, $C_a$ is the area capacitance density, $C_aA$ is the area component, and $[C_e(d_1)l_1+C_e(d_2)l_2+C_e(d_3)w+C_c(d_1, d_3)+C_c(d_2, d_3)]$ is the perimeter component.

This area component $C_aA$ is a function of both the surface area A of the bottom of the diffusion region 330 and the height 360 of the insulator layer 302 ($h_{box}$), both of which were determined at process 204. Specifically, $C_aA$ is proportional to the surface area A of the bottom of the diffusion region 330 and area capacitance density $C_a$ is inversely proportional to the height 360 of the buried oxide $h_{box}$, as indicated in the equation below:

$$C_a = \frac{\varepsilon\varepsilon_0}{h_{box}}, \quad (2)$$

where $\varepsilon_0$ is the vacuum permittivity and $\varepsilon$ is the dielectric constant of the insulator (e.g., buried oxide) material.

The perimeter component $[C_e(d_1)l_1+C_e(d_2)l_2+C_e(d_3)w+C_c(d_1, d_3)+C_c(d_2, d_3)]$ has both a side edge component and a corner component. Specifically, the side edge component is the sum of capacitances associated with each of the three side edges $338_{1-3}$ [i.e., $C_e(d_1)l_1+C_{e2}(d_2)l_2+C_e(d_3)l_2$] and the corner component is the sum of the capacitances associated with the two corners $337_{1-2}$ [i.e., $C_c(d_1, d_3)+C_c(d_1, d_3)$]. For the side edge component, $C_e(d_1)l_1$ is the capacitance associated with side edge $338_1$ and is a function of the distance $336_1$ and the side edge length $335_1$ determined at process 204; $C_e(d_2)l_2$ is the capacitance associated with side edge $338_2$ and is a function of the distance $336_2$ and the side edge length $335_2$ determined at process 204; and $C_e(d_3)l_3$ is the capacitance associated with side edge $338_3$ and is a function of the distance $336_3$ and the side edge length $335_3$ determined at process 204. Thus, each of the side edge capacitances are a function of and, particularly, proportional to the respective length of the given side edge and the distance from that edge to an adjacent conductive structure. For the corner component, $C_c(d_1, d_3)$ is the capacitance associated with corner $337_1$ and is a function of the distances $336_1$ and $336_3$ determined at process 204 and $C_c(d_2, d_3)$ is the capacitance associated with corner $337_2$ and is a function of the distances $336_2$ and $336_3$ determined at process 204. Next, $C_e(d_1)l_1$, $C_e(d_2)l_2$, $C_e(d_3)l_2$, $C_c(d_1, d_3)$, and $C_c(d_1, d_3)$ can be discretely determined and used (e.g., by a capacitance calculator) to solve the $C_{D-S}$ formula at process 216 (see detailed discussion below).

Consider also the case of the shared diffusion region 320 of FETs 310e and 310h of FIGS. 3 and 4. In this case, it was determined at process 204 that there are no corners. Thus, the following formula can be developed at process 212 to express the area and perimeter components of the capacitance $C_{D-S}$ between the diffusion region 330 and the substrate 301:

$$C_{D-S}=C_aA+[C_e(d_1)l_1+C_e(d_2)l_2], \quad (3)$$

where $C_aA$ is the area component and $[C_e(d_1)l_1+C_e(d_2)l_2]$ is the perimeter component.

Again, the area component $C_aA$ is a function of both the surface area A of the bottom of the diffusion region 320 and the height 360 of the insulator layer 302 ($h_{box}$), both of which were determined at process 204. Specifically, $C_aA$ is proportional to the surface area A of the bottom of the diffusion region 330 and area capacitance density $C_a$ is inversely proportional to the height of the buried oxide $h_{box}$, as indicated in the equation (2) above.

The perimeter component $[C_e(d_1)l_1+C_e(d_2)l_2]$ only has a side edge component. Since no corners were identified at process 204 (i.e., since there are no side edges that intersect), the corner component is equal to zero. Thus, the side edge component is simply the sum of capacitances associated with each of the two side edges $328_{1-2}$. For the side edge component, $C_e(d_1)l_1$ is the capacitance associated with side edge $328_1$ and is a function of the distance $326_1$ and the side edge length $325_1$ determined at process 204 and $C_e(d_2)l_2$ is the capacitance associated with side edge $328_2$ and is a function of the distance $326_2$ and the side edge length $325_2$ determined at process 204. Thus, each of the side edge capacitances are functions of and, particularly, proportional to the respective length of the given side edge and the distance from that edge to an adjacent conductive structure. Next, $C_e(d_1)l_1$ and $C_e(d_2)l_2$ can be discretely determined and used (e.g., by a capacitance calculator) to solve the $C_{D-S}$ formula at process 216 (see detailed discussion below).

For example, for a given side edge with a distance d to an adjacent conductive structure, the capacitance per unit length associated with that side edge can be determined as follows:

$$C_e(d) = \varepsilon \varepsilon_0 \frac{K\left(\sqrt{1-k_d^2}\right)}{K(k_d)}, \quad (4)$$

with $$k_d = \frac{\tanh(\pi h_{box}/d)}{\tanh(\pi(h_{box}+h_{diff})/d)}, \quad (5)$$

where $h_{box}$ is the height of the insulator layer (i.e., the separation distance between the diffusion region and the substrate); $h_{diff}$ is the height of the diffusion region (which, in the case of SOI, is typically the thickness of the semiconductor layer above the insulator layer, also referred to herein as $t_{si}$); and K(k) is the complete elliptic integral of the first kind.

Additionally, for a given corner z formed by two intersecting edges a and b, the capacitance associated with that corner z, $C_{cz}$, can be determined as follows:

$$C_{cz} = C_c(d_a, d_b) = \frac{1}{4} f\left(\frac{d_a}{d_b}\right)[d_a C_e(d_a) + d_b C_e(d_b)], \quad (6)$$

with $$f(r) = f\left(\frac{1}{r}\right) = \frac{2}{\pi}\left(r\arctan\frac{1}{r} + \frac{1}{r}\arctan r + \ln\frac{r^2+1}{4r}\right), \quad (7)$$

where $d_a$ is the distance between one side edge a and an adjacent conductive structure; and $d_b$ is the distance between the other side edge b and an adjacent conductive structure.

Figure 5:
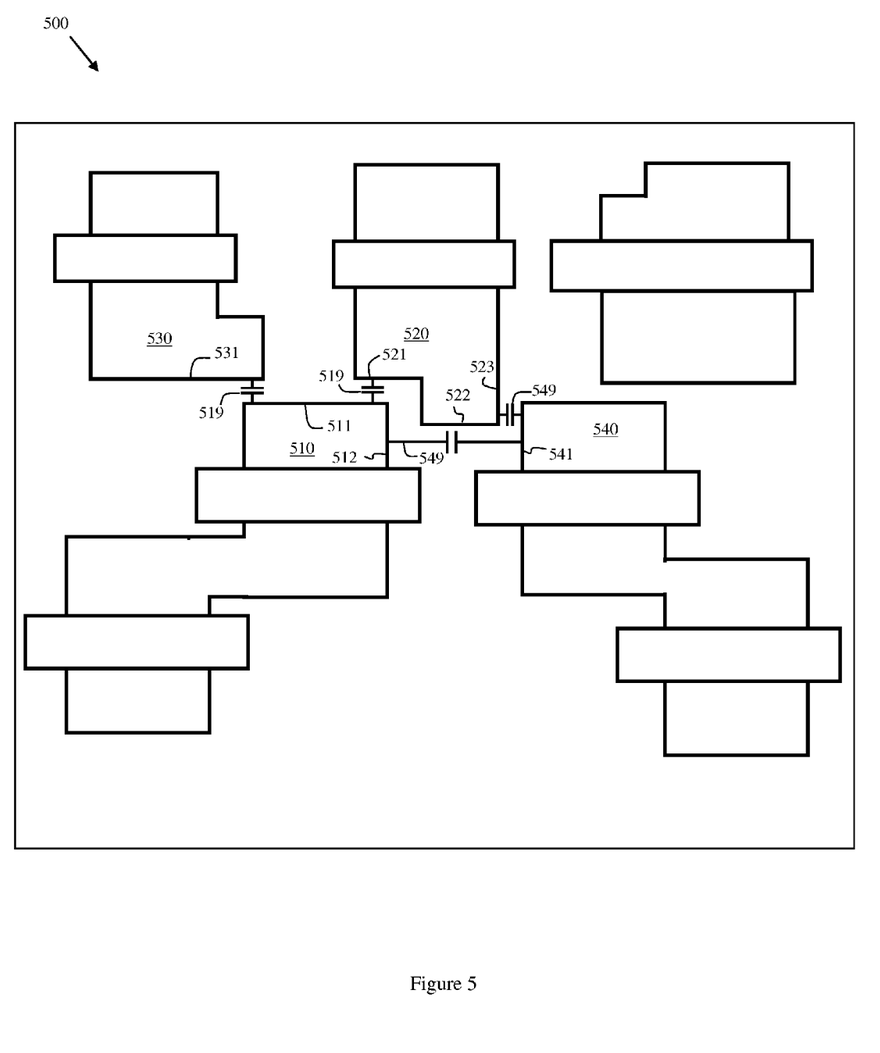
FIG. 5 is a top view diagram illustrating another exemplary integrated circuit layout that can be analyzed according to the method of FIG. 2.

It should be noted that the $C_{D-S}$ formula developed at process 212 will become increasingly more complex as the complexity of the shape of the diffusion region and/or the shape or relative positions of the adjacent conductive structures increases (e.g., see complex diffusion region shapes shown in the exemplary integrated circuit design layout 500 of FIG. 5). For example, the side edge 511 of diffusion region 510 is capacitively coupled (e.g., see capacitances 519) to both the side edge 531 of diffusion region 530 and the side edge 521 of diffusion region 520. Thus, when determining the parasitic capacitance of the diffusion region 510 to the substrate, both the distances between the side edges 511 and 521 and between the side edges 511 and 531 must be considered. Similarly, the side edge 541 of diffusion region 540 is capacitively coupled (e.g., see capacitances 549) to the side edges 522 and 523 of diffusion region 520 and also to the side edge 512 of diffusion region 510. Thus, when determining the parasitic capacitance of the diffusion region 540 to the substrate, the distances between the side edges 541 and 523, between side edges 541 and 522, and between side edges 541 and 512 must be considered. Those skilled in the art will recognize that an electric-magnetic field simulation tool (also referred to as a field solver) can be used to identify each side edge and corner as well as the adjacent conductive structures to which they are capacitively coupled. Alternatively, characterization can be based on semiconductor hardware data. With either approach, the effect of all distances should be included in the simulation and/or characterization.

Optionally, the method embodiments can further comprise developing (e.g., by a capacitance formula generator and based on a set of rules stored in memory) formulas for determining parasitic capacitances ($C_{D-D}$) (i.e., second parasitic capacitances) between that diffusion region and each of the adjacent conductive structures (e.g., between the diffusion region and adjacent diffusion regions, between the diffusion region and adjacent polysilicon gate structures, etc.) (218). Specifically, each $C_{D-D}$ formula can be developed as a function of the distance between a given side edge of the diffusion region and a conductive structure adjacent to that side edge. More particularly, each $C_{D-D}$ between a diffusion region and an adjacent conductive structure will be proportional to a surface area of a given side edge and inversely proportional to a distance between the given side edge and the adjacent conductive structure, as indicated by the following equation, $$C_{D-D}(d) = \frac{\varepsilon_0 \varepsilon h_{diff} l}{d}, \quad (8)$$

where d is the distance between the given side edge and the adjacent conductive structure, $h_{diff}$ is the height of the diffusion region (in this case, the thickness of the semiconductor layer of the SOI wafer, which is also referred to herein as $t_{si}$) and l is the length of the given side edge. It should be noted that l times $h_{diff}$ is applicable for an essentially rectangular shaped side edge. This equation would differ for a side edge having a different shape.

Finally, the method embodiments can comprise modeling (e.g., by a simulator) performance of the SOI device based on the parasitic capacitance values $C_{D-S}$ and, if applicable, $C_{D-D}$ determined for each diffusion region of the device (220). Specifically, the formula for $C_{D-S}$ and, if applicable, the formulas for $C_{D-D}$ can, for example, be used by SOI device models and parasitic extraction tools, which determine parasitics and generate a SPICE (Simulation Program with Integrated Circuit Emphasis) netlist based a circuit layout. Thus, the capacitance $C_{D-S}$ between the diffusion region and the substrate and, if determined, the capacitances $C_{D-D}$ between the diffusion region and each of the adjacent structures can then be used to more accurately simulate the performance of the SOI device.

Figure 6:
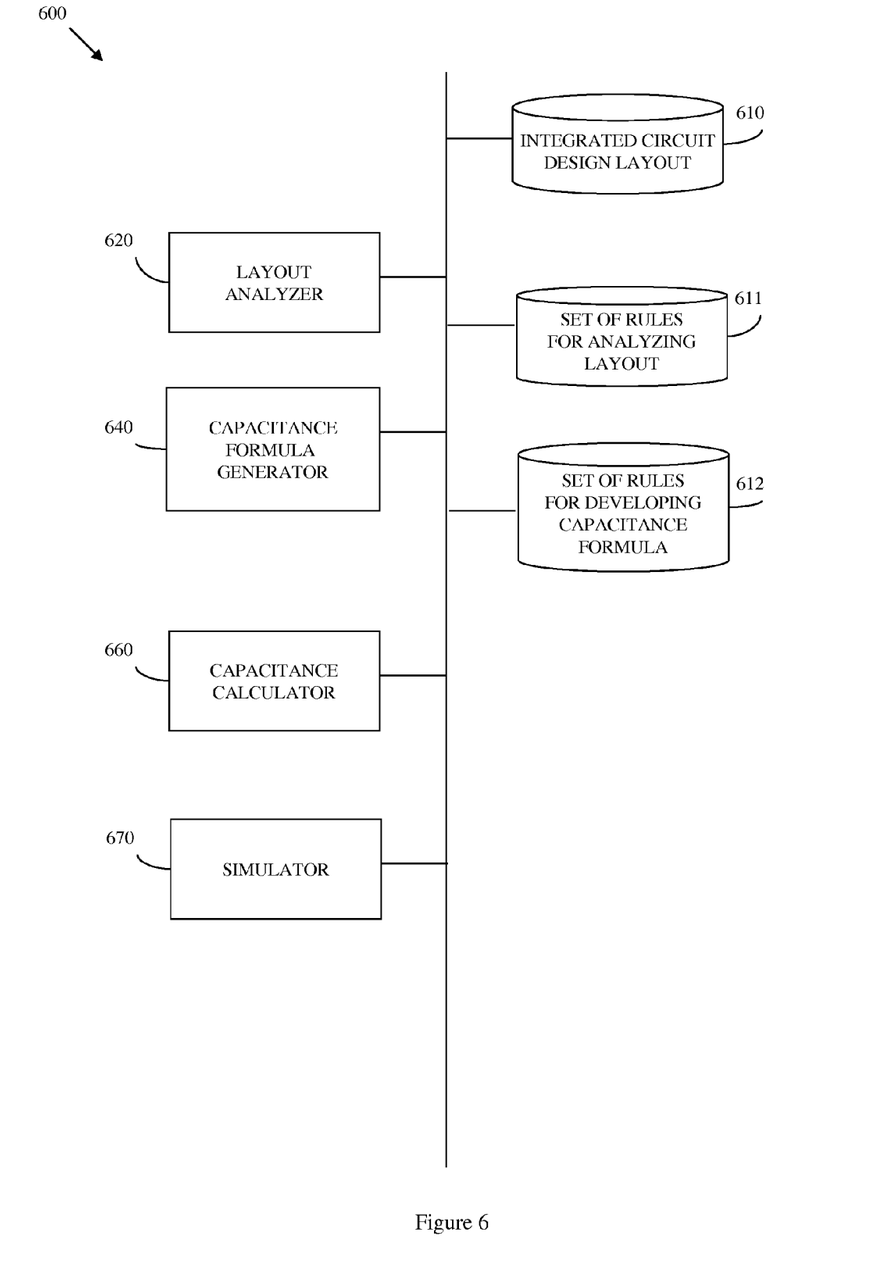
FIG. 6 is a schematic diagram illustrating embodiments of a system for modeling parasitic capacitance associated with a diffusion region of a silicon-on-insulator (SOI) device.

Also disclosed herein are embodiments of a system 600 for modeling parasitic capacitance associated with a diffusion region of a silicon-on-insulator (SOI) device, as shown in FIG. 6. The system 600 can be implemented, for example, in a computer hardware environment such as that described in detail below and depicted in FIG. 7. Specifically, referring to FIG. 6, the system 600 embodiments can comprise one or more memory devices and one or more computer processing units (i.e., processors) in communication with the memory device(s).

The memory device(s) can store (i.e., can be adapted to store, configured to store, etc.) an integrated circuit design layout 610 (e.g., see the layout 300, shown in FIGS. 3 and 4) as well as sets of rules 630, 650 that can be applied by the processor(s). The processor(s) can comprise at least a layout analyzer 620, a capacitance formula generator 640, a capacitance calculator 660.

The layout analyzer 620 can access (i.e., can be adapted to access, configured to access, programmed to access, etc.) the integrated circuit design layout 610 and can analyze (i.e., can be adapted to analyze, configured to analyze, programmed to analyze, etc.) the layout in order to determine shape, dimension and proximity information related to a specific diffusion region of a specific SOI device contained within the integrated circuit (see detail discussion above with regard to process 204 of the method embodiment). Such information can be determined based on a set of rules 611 stored in memory and can include, but is not limited to, the following: the three-dimensional shape of the diffusion region; the surface area of the bottom of the diffusion region; any side edges of the diffusion region that are capacitively coupled to adjacent conductive structures (e.g., adjacent diffusion regions, polysilicon gate structures, any other conductive structure, etc.); the dimensions (e.g., height, length, surface area) of each of those side edges; the distances from the side edges to the adjacent conductive structures; any corners where any two of the previously identified side edges intersect; and the separation distance between the diffusion region and the substrate (e.g., the height of the insulator layer ($h_{box}$) of an SOI wafer). The layout analyzer 620 can repeated this process for each of the diffusion regions in the layout 300.

The capacitance formula generator 640 can develop (i.e., can be adapted to develop, configured to develop, programmed to develop, etc.), for each diffusion region and based on a set of rules 612 stored in memory, a formula for determining the parasitic capacitance ($C_{D-S}$) between that diffusion region and the substrate below the diffusion region (see detailed discussion above with regard to process step 212 of the method embodiments). This formula for $C_{D-S}$ can specifically be developed based on the shape, dimension and proximity information determined by the layout analyzer 620.

Specifically, as with prior art techniques, this formula for $C_{D-S}$ can be developed by the capacitance formula generator 640 such that it has both an area component associated with the bottom surface of the diffusion region and a perimeter component associated with the side edges of the diffusion region. However, in the embodiments disclosed herein, the perimeter component is based, not only on the surface area of the side edges of the diffusion region and the height of the insulator layer ($h_{box}$) separating it from the substrate, but also on the distances, determined by the layout analyzer 620, between the side edges of the diffusion region and the adjacent conductive structures. Specifically, the perimeter component can have a side edge component that is equal to a sum of capacitances associated with each of the side edges identified and each side edge capacitance can be based on the length of that side edge as well as the distance between that side edge and an adjacent conductive structure. If applicable, the perimeter component can also have a corner component that is equal to the sum of capacitances associated with the each of the corners identified and each corner capacitance can be based on the distances between the side edges that intersect at the corner and the adjacent conductive structures. That is, each corner capacitance can be based on a first distance from a first side edge at a given corner to a first conductive structure adjacent to the first side edge and further based on a second distance from a second side edge at the given corner to a second conductive structure adjacent to the second side edge.

The capacitance calculator 660 can then solve (i.e., can be adapted to solve, programmed to solve, configured to solve, etc.) the $C_{D-S}$ formula developed by the capacitance formula generator 640 (see detailed discussion above with regard to process step 216 of the method embodiments).

Optionally, the capacitance formula generator 640 can also develop, based on a set of rules 612 stored in memory, formulas for determining parasitic capacitances ($C_{D-D}$) (i.e., second parasitic capacitances) between that diffusion region and each of the adjacent conductive structures (e.g., between the diffusion region and adjacent diffusion regions, between the diffusion region and adjacent polysilicon gate structures, etc.) (see detailed discussion above with regard to process step 218 of the method embodiments). Specifically, each $C_{D-D}$ formula can be developed as a function of the distance between a given side edge of the diffusion region and a conductive structure adjacent to that side edge. More particularly, each $C_{D-D}$ between a diffusion region and an adjacent conductive structure will be proportional to a surface area of a given side edge and inversely proportional to a distance between the given side edge and the adjacent conductive structure.

Finally, the system 600 embodiments can further comprise a simulator 670. This simulator can model (i.e., can be adapted to model, configured to model, programmed to model, etc.) the performance of the SOI device based on the parasitic capacitance values $C_{D-S}$ and, if applicable, $C_{D-D}$ determined for each diffusion region of the device (see detailed discussion above with regard to process step 220 of the method embodiments). Specifically, the formula for $C_{D-S}$ and, if applicable, the formulas for $C_{D-D}$ can, for example, be used by SOI device models and parasitic extraction tools, which determine parasitics and generate a SPICE (Simulation Program with Integrated Circuit Emphasis) netlist based a circuit layout. Thus, the capacitance $C_{D-S}$ between the diffusion region and the substrate and, if determined, the capacitances $C_{D-D}$ between the diffusion region and each of the adjacent structures can then be used to more accurately simulate the performance of the SOI device.

Simulators for modeling device performance as a function of parasitic capacitances are well-known in the art and, thus, the details of such a simulator are omitted from the specification in order to allow the reader to focus on the salient aspects of the disclosed embodiments.

Also disclosed are embodiments of non-transitory program storage device that is readable by a computer and that tangibly embodies a program of instructions executable by the computer to perform the above-described method embodiments for modeling parasitic capacitance associated with a diffusion region of a silicon-on-insulator (SOI) device. More specifically, as will be appreciated by one skilled in the art, aspects of the embodiments disclosed herein may be implemented as a system, method or computer program product. Accordingly, aspects of the embodiments disclosed herein may be implemented entirely in hardware, entirely in software (including firmware, resident software, micro-code, etc.) or in a combination of both software and hardware that may all generally be referred to herein as a "circuit," "module" or "system." Furthermore, aspects of the embodiments disclosed herein may take the form of a computer program product embodied in one or more computer readable medium(s) having computer readable program code embodied thereon.

Any combination of one or more computer readable medium(s) may be utilized. The computer readable medium may be a non-transitory computer readable storage device or a computer readable signal medium. A non-transitory computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

As mentioned above, the computer readable medium can alternatively comprise a computer readable signal medium that includes a propagated data signal with computer readable program code embodied therein, for example, in baseband or as part of a carrier wave. Such a propagated signal may take any of a variety of forms, including, but not limited to, electromagnetic, optical, or any suitable combination thereof. This computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed embodiments are described above with reference to flowchart illustrations and/or block diagrams of methods, apparatus (systems) and computer program products. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 7:
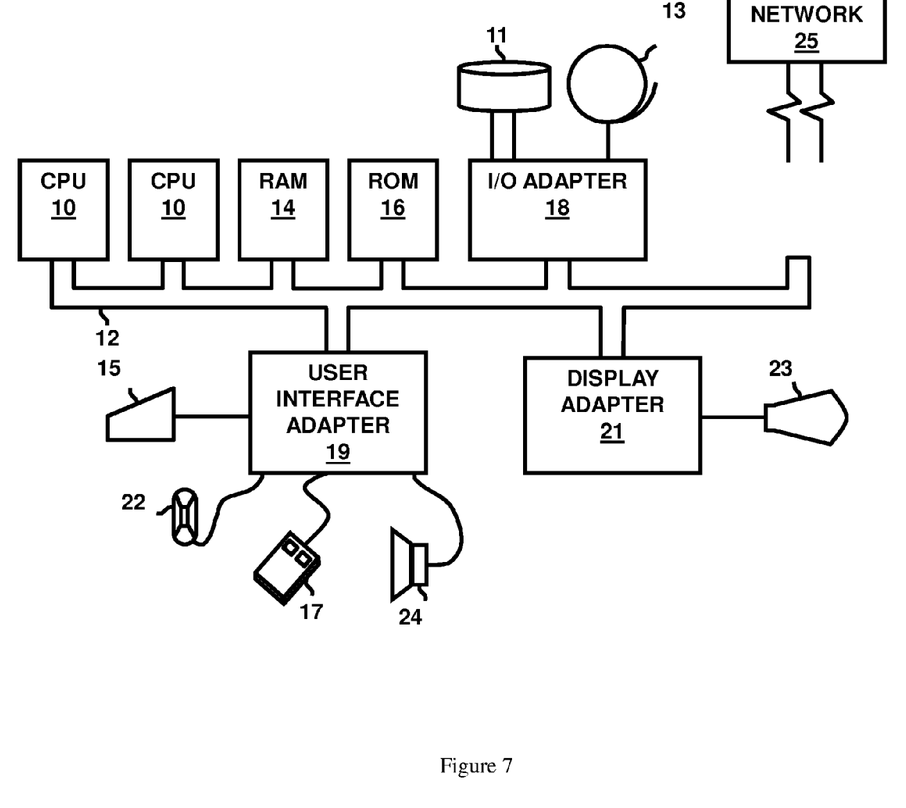
FIG. 7 is an exemplary hardware environment that can be used to implement the disclosed embodiments.

As mentioned above, the representative hardware environment for practicing the disclosed method, system and program storage device embodiments is depicted in FIG. 7. This schematic drawing illustrates a hardware configuration of an information handling/computer system in accordance with the disclosed embodiments. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the disclosed embodiments. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the flowcharts and block diagrams in the Figures referenced above illustrate the architecture, functionality, and operation of the various possible implementations of the disclosed systems, methods and computer program products. In this regard, each block in the flowchart or block diagrams may represent a module, segment, or portion of code, which comprises one or more executable instructions for implementing the specified logical function(s). It should also be noted that, in some alternative implementations, the functions noted in any block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should further be understood that the terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises", "comprising," "included," and/or "including," when used in this specification, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the disclosed embodiments has been presented for purposes of illustration and description, but is not intended to be exhaustive or limiting in the form disclosed. Many modifications and variations will be apparent to those of ordinary skill in the art without departing from the scope and spirit disclosed embodiments.

Therefore, disclosed above are embodiments of a method, system and program storage device for accurately modeling parasitic capacitance(s) associated with a diffusion region of a silicon-on-insulator (SOI) device and doing so based, at least in part, on the proximity of the diffusion region to adjacent conductive structures (e.g., adjacent diffusion regions). Specifically, in these embodiments, the layout of an integrated circuit design can be analyzed in order to determine, for the diffusion region, shape, dimension and proximity information. Then, a formula can be developed and used for determining the parasitic capacitance between the diffusion region and the substrate below ($C_{D-S}$). This formula can have a perimeter component that includes a side edge component and, if applicable, a corner component, both of which account for the fact that $C_{D-S}$ is generally dependent on the distances between the diffusion region and any adjacent conductive structures. In these embodiments, the parasitic capacitance between the diffusion region and any adjacent conductive structure ($C_{D-D}$) can also be determined based on such distances.

What is claimed is:

1. A computer-implemented method for modeling parasitic capacitance associated with a diffusion region of a silicon-on-insulator (SOI) device, said method comprising:
   analyzing, by a computer, an integrated circuit design layout to at least identify side edges of said diffusion region that are capacitively coupled to adjacent conductive structures and determine distances from each of said side edges to said adjacent conductive structures, said analyzing further comprising identifying any corners where two of said side edges intersect;
   developing, by said computer, a formula for determining parasitic capacitance between said diffusion region and a substrate below said diffusion region, said formula having a perimeter component comprising at least a side edge component that is based on said distances and a corner component, said corner component being equal to zero when none of said side edges intersect; and
   using said formula to determine said parasitic capacitance.

2. The method of claim 1, said side edge component comprising a sum of side edge capacitances with each side edge capacitance being proportional to a length of a given side edge and being dependent on a distance of said given side edge to an adjacent conductive structure.

3. The method of claim 1, when at least one corner is identified, said corner component comprising a sum of corner capacitances with each corner capacitance being based on a first distance from a first side edge at a given corner to a first conductive structure adjacent to said first side edge and further based on a second distance from a second side edge at said given corner to a second conductive structure adjacent to said second side edge.

4. The method of claim 1,
   said diffusion region being separated from said substrate by an insulator layer,
   said analyzing further comprising determining a bottom surface area of said diffusion region and a height of said insulator layer, and
   said formula further having an area component, said area component being inversely proportional to said height of said insulator layer and proportional to said bottom surface area of said diffusion region.

5. The method of claim 1, said adjacent conductive structures comprising diffusion regions of other silicon-on-insulator (SOI) devices.

6. A computer-implemented method for modeling parasitic capacitance associated with a diffusion region of a silicon-on-insulator (SOI) device, said method comprising:
   analyzing, by a computer, an integrated circuit design layout to identify side edges of said diffusion region that are capacitively coupled to adjacent conductive structures, to further identify corners where any two of said side edges intersect, and to determine distances from each of said side edges to said adjacent conductive structures;
   developing, by said computer, a formula for determining a first parasitic capacitance between said diffusion region and a substrate below said diffusion region, said formula having a perimeter component comprising at least a side edge component and a corner component that are each based on said distances;
   using said formula to determine said first parasitic capacitance; and
   determining, by said computer and also based on said distances, second parasitic capacitances between said diffusion region and each of said adjacent conductive structures.

7. The method of claim 6, said side edge component comprising a sum of side edge capacitances with each side edge capacitance being proportional to a length of a given side edge and being dependent on a distance of said given side edge to an adjacent conductive structure.

8. The method of claim 6,
   said corner component comprising a sum of corner capacitances with each corner capacitance being based on a first distance from a first side edge at a given corner to a first conductive structure adjacent to said first side edge and further based on a second distance from a second side edge at said given corner to a second conductive structure adjacent to said second side edge.

9. The method of claim 8, said corner component being equal to zero when none of said side edges intersect.

10. The method of claim 6, said diffusion region being separated from said substrate by an insulator layer, said analyzing comprising determining a bottom surface area of said diffusion region and a height of said insulator layer and said formula further having an area component, said area component being inversely proportional to said height of said insulator layer and proportional to said bottom surface area of said diffusion region.

11. The method of claim 6, said analyzing further comprising determining surfaces areas of said side edges, each second parasitic capacitance being proportional to a surface area of a given side edge and inversely proportional to a distance between said given side edge and an adjacent conductive structure.

12. The method of claim 6, said adjacent conductive structures comprising diffusion regions of other silicon-on-insulator (SOI) devices.

13. A system for modeling parasitic capacitance associated with a diffusion region of a silicon-on-insulator (SOI) device, said system comprising:
   a memory storing an integrated circuit design layout; and
   at least one processor comprising:
      a layout analyzer accessing said layout and analyzing said layout to identify side edges of said diffusion region that are capacitively coupled to adjacent conductive structures, to further identify corners where any two of said side edges intersect, and to determine distances from each of said side edges to said adjacent conductive structures;

a formula generator developing a formula for determining parasitic capacitance between said diffusion region and a substrate below said diffusion region, said formula having a perimeter component comprising at least a side edge component and a corner component that are each based on said distances; and a calculator using said formula to determine said parasitic capacitance.

14. The system of claim 13, said side edge component comprising a sum of side edge capacitances with each side edge capacitance being a length of a given side edge and being dependent on a distance of said given side edge to an adjacent conductive structure.

15. The system of claim 13, said corner component comprising a sum of corner capacitances with each corner capacitance being based on a first distance from a first side edge at a given corner to a first conductive structure adjacent to said first side edge and further based on a second distance from a second side edge at said given corner to a second conductive structure adjacent to said second side edge.

16. The system of claim 13, said corner component being equal to zero when none of said side edges intersect.

17. The system of claim 13, said layout analyzer further analyzing said layout to determine a bottom surface area of said diffusion region and a height of an insulator layer separating said diffusion region from said substrate, and said formula generator further developing said formula such that said formula has an area component, said area component being inversely proportional to said height of said insulator layer and proportional to said bottom surface area of said diffusion region.

18. The system of claim 13, said adjacent conductive structures comprising diffusion regions of other silicon-on-insulator (SOI) devices.

19. The system of claim 13, said calculator further determining, based on said distances, second parasitic capacitances between said diffusion region and each of said adjacent conductive structures.

20. A tangible program storage device readable by a computer and tangibly embodying a program of instructions executable by said computer to perform a method for modeling parasitic capacitance associated with a diffusion region of a silicon-on-insulator (SOI) device, said method comprising:

analyzing an integrated circuit design layout to identify side edges of said diffusion region that are capacitively coupled to adjacent conductive structures, to further identify corners where any two of said side edges intersect, and to determine distances from each of said side edges to said adjacent conductive structures;

developing, for said diffusion region, a formula for determining parasitic capacitance between said diffusion region and a substrate below said diffusion region, said formula having a perimeter component comprising at least a side edge component and a corner component that are each based on said distances; and using said formula to determine said parasitic capacitance.

21. The program storage device of claim 20, said diffusion region being separated from said substrate by an insulator layer, said analyzing further comprising determining a bottom surface area of said diffusion region and a height of said insulator layer, and said formula further having an area component, said area component being inversely proportional to said height of said insulator layer and proportional to said bottom surface area of said diffusion region.

22. The program storage device of claim 20, said side edge component comprising a sum of side edge capacitances with each side edge capacitance being proportional to a length of a given side edge and being dependent on a distance of said given side edge to an adjacent conductive structure.

23. The program storage device of claim 20, said corner component comprising a sum of corner capacitances with each corner capacitance being based on a first distance from a first side edge at a given corner to a first conductive structure adjacent to said first side edge and further based on a second distance from a second side edge at said given corner to a second conductive structure adjacent to said second side edge.

\* \* \* \* \*